(12) United States Patent
Wan et al.

(10) Patent No.: US 12,253,313 B2
(45) Date of Patent: Mar. 18, 2025

(54) HEAT DISSIPATION DEVICE FOR MULTIPOINT HEAT SOURCE

(71) Applicant: Man Zai Industrial CO., LTD., Tainan (TW)

(72) Inventors: Cheng-Chien Wan, Tainan (TW); Cheng-Rui Wan, Tainan (TW); Chun-Hsien Su, Tainan (TW); Hui-Fen Huang, Tainan (TW); Fong Jou Tu, Tainan (TW); Chi Cheng Chen, Tainan (TW); Chuan Meng Wang, Tainan (TW)

(73) Assignee: MAN ZAI INDUSTRIAL CO., LTD., Tainan (TW)

( * ) Notice: Subject to any disclaimer, the term of this patent is extended or adjusted under 35 U.S.C. 154(b) by 320 days.

(21) Appl. No.: 17/854,465

(22) Filed: Jun. 30, 2022

(65) Prior Publication Data
US 2023/0314088 A1 Oct. 5, 2023

(30) Foreign Application Priority Data
Apr. 1, 2022 (TW) ................ 111112880

(51) Int. Cl.
F28D 15/02 (2006.01)
F28D 15/04 (2006.01)
H05K 7/20 (2006.01)

(52) U.S. Cl.
CPC ..... *F28D 15/0266* (2013.01); *F28D 15/0233* (2013.01); *F28D 15/04* (2013.01); *H05K 7/20336* (2013.01)

(58) Field of Classification Search
CPC .. F28D 15/0266; F28D 15/0233; F28D 15/04; H05K 7/20336
See application file for complete search history.

(56) References Cited

U.S. PATENT DOCUMENTS

| | | | | |
|---|---|---|---|---|
| 2013/0333414 | A1* | 12/2013 | Inaba | H05K 7/20 62/513 |
| 2014/0116653 | A1* | 5/2014 | Lange | F28D 15/0275 165/104.21 |
| 2017/0003083 | A1* | 1/2017 | Manninen | H05K 7/20327 |

FOREIGN PATENT DOCUMENTS

CN 202813896 U * 3/2013

OTHER PUBLICATIONS

Pdf is translation of foreign reference CN 202813896 U (Year: 2013).*

* cited by examiner

*Primary Examiner* — Henry T Crenshaw
*Assistant Examiner* — Kamran Tavakoldavani
(74) *Attorney, Agent, or Firm* — Muncy, Geissler, Olds & Lowe, P.C.

(57) ABSTRACT

A heat dissipation device for a multipoint heat source includes an evaporator unit and a condenser unit. The evaporator unit includes a multi-channel duct. At least one narrow side of the multi-channel duct has a communication opening in communication with the bottom side of at least one tube of the condenser unit, and a wide side of the multi-channel duct is attached to the multipoint heat source so that a heat conduction medium can be circulated through the evaporator unit and the condenser unit while alternating between a liquid phase and a gaseous phase.

17 Claims, 9 Drawing Sheets

HEAT DISSIPATION DEVICE FOR MULTIPOINT HEAT SOURCE

BACKGROUND OF THE INVENTION

1. Technical Field

The present invention relates to a heat dissipation device and more particularly to a heat dissipation device for a multipoint heat source.

2. Description of Related Art

With the continual advancement of technology, a variety of multifunctional high-performance electronic products have been developed and improved incessantly. The performance of an electronic product is highly correlated to temperature in such a way that when the temperature of the electronic product rises and results in an over-heated environment, the performance of the electronic product will be lowered.

In practice, the component of an electronic product that is the most likely to generate high heat is the processor, a chip, or the like. Generally, electrical connection to a processor or chip is formed by solder pads, and the working temperature of such a manufacturing process is between 110° C. and 200° C. The working temperature may be a little higher (e.g., about 230° C.) in order to melt the solder during the soldering operation. It can be known from the above that a processor or chip will not be directly damaged by a certain high-temperature environment. The majority of high-power devices (e.g., the servers in a datacenter), however, are required to work continuously in a high-power state in order to achieve the corresponding performance. It is therefore important for those devices to have higher heat dissipation efficiency than their respective temperature increase rates. If heat accumulates faster than it is dissipated, overheating will soon take place, leading to such problems as a low operation speed or program execution speed, device breakdown, or even a power supply failure. Should the temperature exceed the melting point of the solder, the solder will melt and make an open circuit as a result. To protect the circuitry, therefore, it is imperative to prevent the temperature from rising persistently.

One major way to ensure the performance of a high-power electronic product is to lower the temperature of the environment with an air-conditioning device. An even more direct, and perhaps the most effective, method is to install a heat dissipation device at the location of a device that generates high heat, in order for the heat conduction medium in the heat dissipation device to carry out highly efficient heat exchange and thereby increase the heat dissipation efficiency of the electronic product in question, the objective being to control, to the greatest extent possible, the temperature of the electronic product within a reasonable range that enables sustained normal operation. However, as a common electronic product has limitations in internal space allocation, there are requirements for not only the efficiency of heat dissipation from the electronic product, but also the volume, size, and specifications of the heat dissipation device to be used. Obviously, it is an issue to be constantly addressed by the related industries to optimize the heat dissipation efficiency of electronic products under the condition of a limited space so as to meet manufacturers' needs.

BRIEF SUMMARY OF THE INVENTION

The main object of the present invention is to provide a multipoint heat sources type heat dissipating device, which comprises an evaporator unit and a condenser unit. The evaporator unit includes a multi-channel duct, a plurality of separated channels provided in the multi-channel duct, and a first communication opening and a second communication opening that are provided at two lateral narrow sides of the multi-channel duct respectively. The condenser unit includes a plurality of first tubes that are arranged in a parallel manner in a first direction, a second tube provided at a first end of the first tubes, and a third tube provided at a second end of the first tubes. The bottom side of the second tube is provided with a first connection channel in communication with the first communication opening, and the bottom side of the third tube is provided with a second connection channel in communication with the second communication opening. The narrow sides of the multi-channel duct face the first tubes and are parallel or generally parallel to the first tubes. A wide side of the multi-channel duct is attached to the multipoint heat source in order for the heat conduction medium to be circulated while alternating between a liquid phase and a gaseous phase.

Another object of the present invention is to provide a multipoint heat sources type heat dissipating device, which comprises an evaporator unit and a condenser unit. The evaporator unit includes a multi-channel duct, a plurality of separated channels provided in the multi-channel duct, and a communication opening that is in communication with the separated channels and is provided at a narrow side of the multi-channel duct. The condenser unit includes a plurality of first tubes that are arranged in a parallel manner in a first direction, a second tube provided at a first end of the first tubes, and a third tube provided at a second end of the first tubes. The communication opening at the narrow side of the multi-channel duct is inserted perpendicularly into the bottom side of the bottommost first tube such that the separated channels are in communication with the bottommost first tube. A wide side of the multi-channel duct is attached to the multipoint heat source in order for a heat conduction medium to be circulated through the evaporator unit and the condenser unit while alternating between a liquid phase and a gaseous phase.

Another object of the present invention is to provide a multipoint heat sources type heat dissipating device, which comprises an evaporator unit and a condenser unit. The evaporator unit includes a multi-channel duct, a plurality of separated channels provided in the multi-channel duct, and a communication opening that is in communication with the separated channels and is provided at a narrow side of the multi-channel duct. The condenser unit includes a plurality of first tubes that are arranged in a parallel manner in a first direction, a second tube provided at a first end of the first tubes, and a third tube provided at a second end of the first tubes. The communication opening at the narrow side of the multi-channel duct is inserted perpendicularly into the bottommost first tube and extends into the bottom side of the second tube and/or the bottom side of the third tube such that the separated channels are in communication with the bottommost first tube and the second tube and/or the bottom side of the third tube. A wide side of the multi-channel duct is attached to the multipoint heat source in order for a heat conduction medium to be circulated through the evaporator unit and the condenser unit while alternating between a liquid phase and a gaseous phase.

The evaporator unit in the present invention includes a multi-channel duct. At least one narrow side of the multi-channel duct has a communication opening in communication with the bottom side of at least one tube of the condenser unit, and a wide side of the multi-channel duct is attached to a multipoint heat source in order to absorb heat from the heat source. A heat conduction medium, therefore, can be circulated through the evaporator unit and the condenser unit while alternating between a liquid phase and a gaseous phase to dissipate heat.

DETAILED DESCRIPTION OF THE INVENTION

The technical contents of the present invention are detailed below with reference to the accompanying drawings. The drawings, however, are provided only to facilitate description, are not necessarily drawn to scale, and may be exaggerated. The drawings and the proportions shown therein are not intended to be restrictive of the scope of the invention.

To begin with, one embodiment of the present invention is described below with reference to FIG. 1, which is a perspective view of the heat dissipation device for a multipoint heat source according to the first embodiment of the invention.

Figure 1:
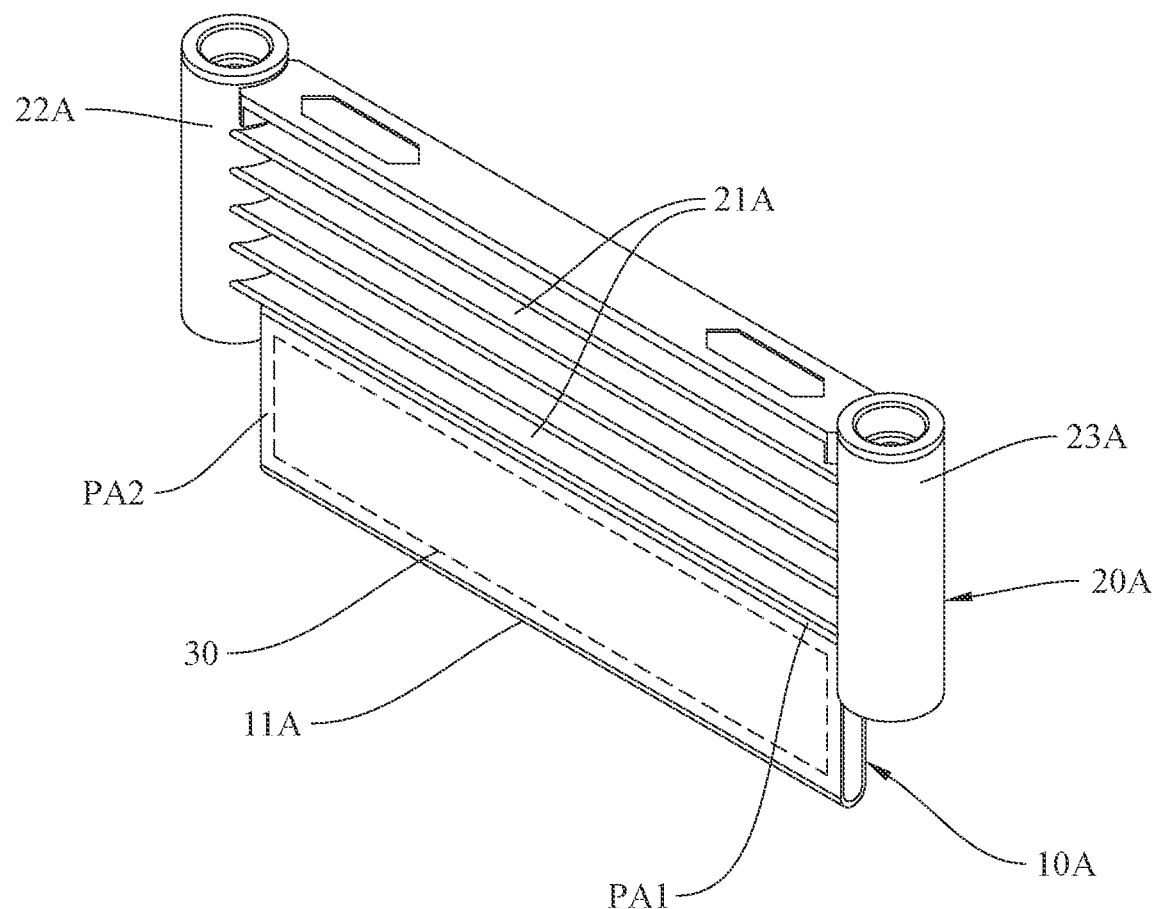
FIG. 1 is a perspective view of the heat dissipation device for a multipoint heat source according to the first embodiment of the present invention.

As shown in FIG. 1, the heat dissipation device 100 for a multipoint heat source according to this embodiment includes an evaporator unit 10A and a condenser unit 20A and is configured to dissipate heat from a multipoint heat source 30 (as indicated by the dashed line in FIG. 1). The multipoint heat source 30 may be, for example, a random access memory (RAM). The heat dissipation device 100 for a multipoint heat source uses a heat conduction medium that is added in an overfilling manner. The heat conduction medium may be, for example, a refrigerant. The heat conduction medium dissipates heat by being circulated through the evaporator unit 10A and the condenser unit 20A while alternating between a liquid phase and a gaseous phase.

Figure 2:
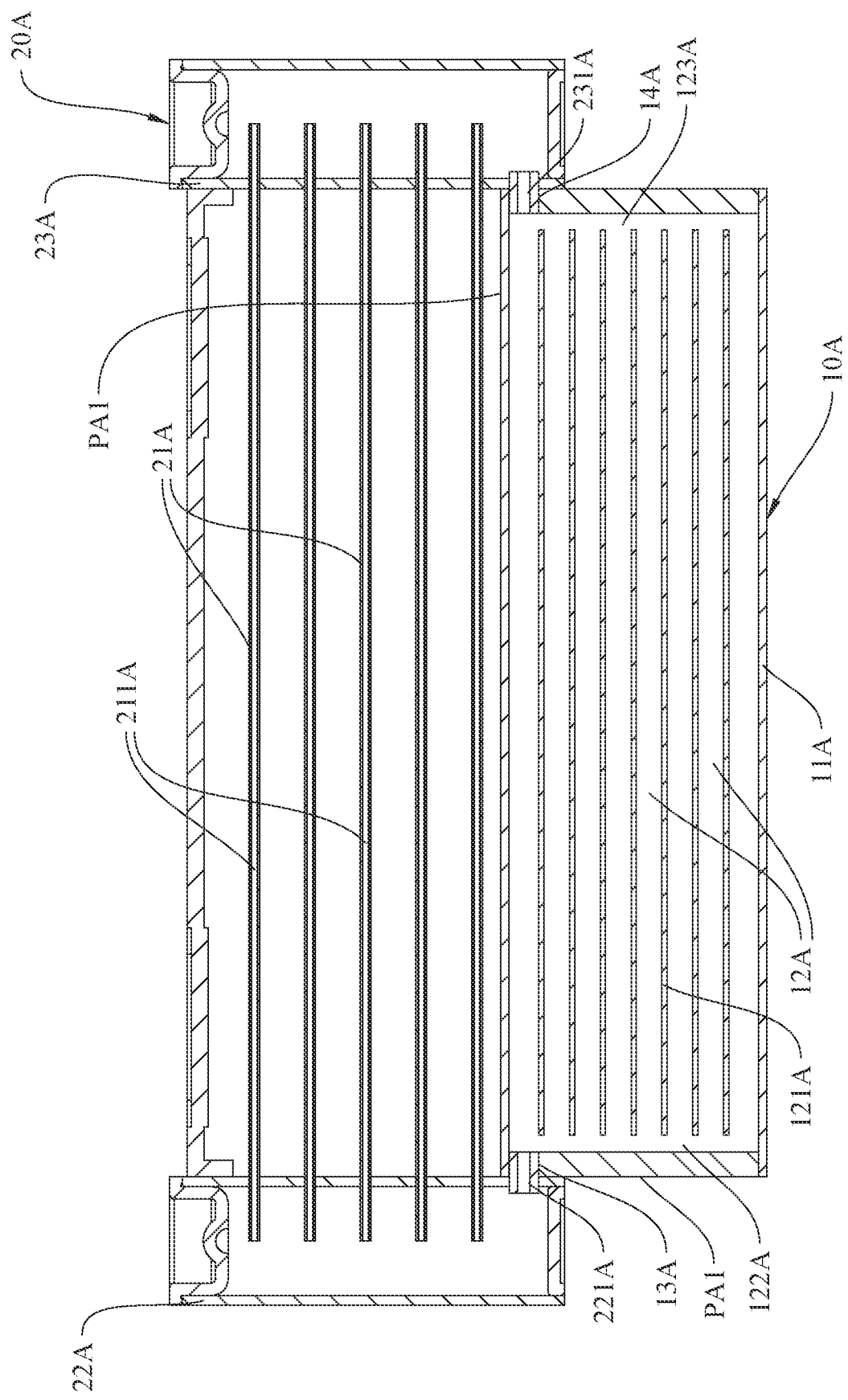
FIG. 2 is a sectional view of the heat dissipation device for a multipoint heat source according to the first embodiment of the invention.
Figure 3:
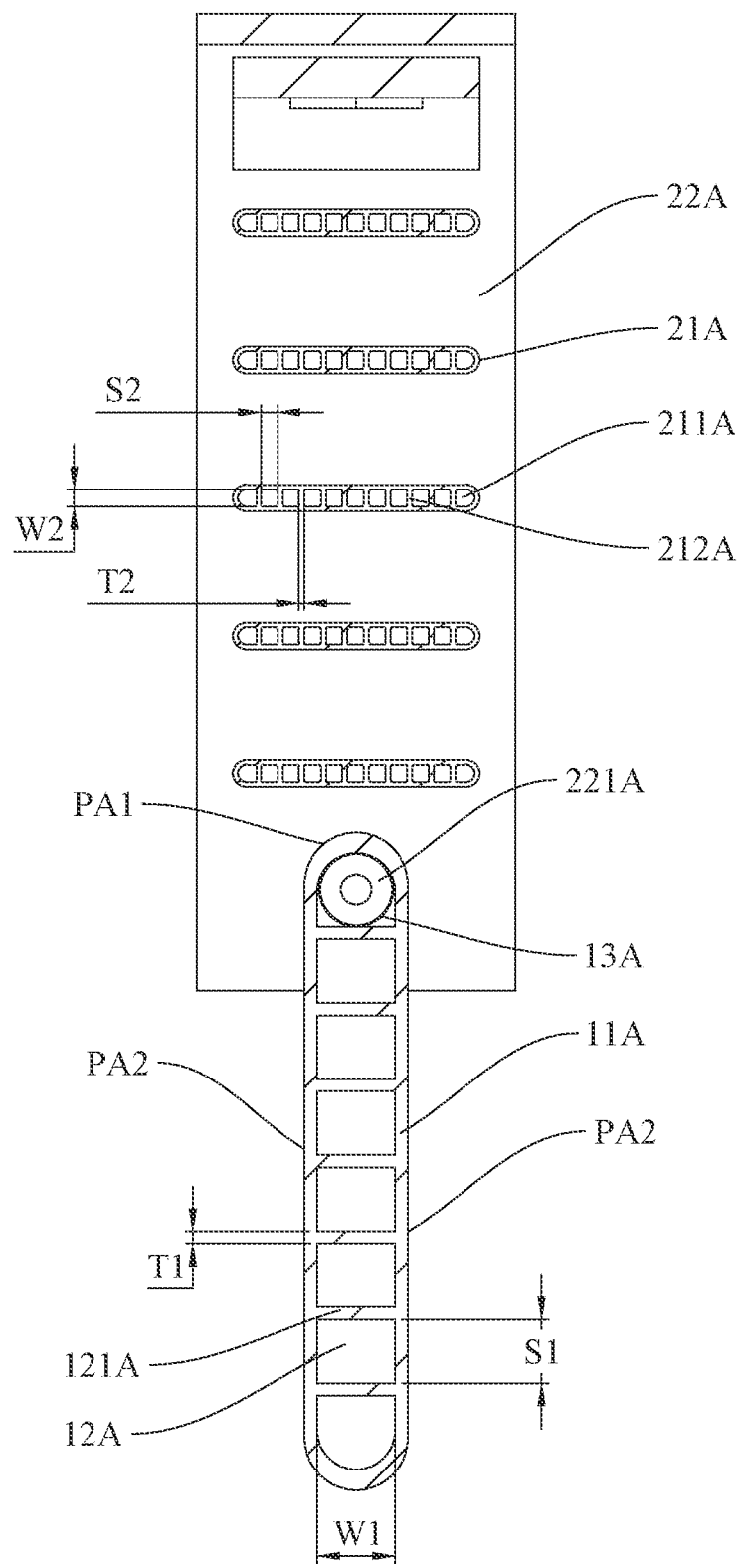
FIG. 3 is another sectional view of the heat dissipation device for a multipoint heat source according to the first embodiment of the invention.

FIG. 2 and FIG. 3 show two sectional views of the heat dissipation device for a multipoint heat source according to the first embodiment of the present invention.

As shown in FIG. 2 and FIG. 3, the evaporator unit 10A includes a multi-channel duct 11A, a plurality of separated channels 12A provided in the multi-channel duct 11A, and a first communication opening 13A and a second communication opening 14A that are provided at two lateral narrow sides PA1 of the multi-channel duct 11A respectively. The condenser unit 20A includes a plurality of first tubes 21A that are arranged in a parallel manner in a first direction, a second tube 22A provided at a first end of the first tubes 21A, and a third tube 23A provided at a second end of the first tubes 21A. The bottom side of the second tube 22A is provided with a first connection channel 221A in communication with the first communication opening 13A, and the bottom side of the third tube 23A is provided with a second connection channel 231A in communication with the second communication opening 14A. The narrow sides PA1 of the multi-channel duct 11A face the first tubes 21A and are parallel or generally parallel to the first tubes 21A. A wide side PA2 of the multi-channel duct 11A is attached to the multipoint heat source 30 in order for the heat conduction medium to be circulated while alternating between a liquid phase and a gaseous phase.

There is only one multi-channel duct 11A, and a single flat surface of the multi-channel duct 11A is attached to the multipoint heat source in order to absorb heat from the heat source uniformly. In one embodiment, the multi-channel duct 11A may be integrally formed by aluminum extrusion so as to have a flat cross section and be able to withstand the pressure generated by passage of the heat conduction medium. In another embodiment, the multi-channel duct 11A may be made of aluminum, an aluminum alloy, or another similar material; the present invention has no limitation in this regard.

The multi-channel duct 11A is provided therein with a plurality of partition plates 121A that are integrally formed with the multi-channel duct 11A to define the separated channels 12A. Each partition plate 121A may have a thickness T1 ranging from 0.2 mm to 1.0 mm, such as 0.2 mm to 0.3 mm, 0.3 mm to 0.4 mm, 0.4 mm to 0.5 mm, 0.5 mm to 0.6 mm, 0.7 mm to 0.8 mm, 0.8 mm to 0.9 mm, 0.9 mm to 1.0 mm, or 0.2 mm, 0.25 mm, 0.3 mm, 0.35 mm, 0.4 mm, 0.45 mm, 0.5 mm, 0.55 mm, 0.6 mm, 0.65 mm, 0.7 mm, 0.75 mm, 0.8 mm, 0.85 mm, 0.9 mm, 0.95 mm, 1.0 mm, in order to enhance the structural strength of, and thermal conduction through, the multi-channel duct 11A. Each partition plate 121A may have a width W1 ranging from 1.0 mm to 8.0 mm, such as 1.0 mm to 2.0 mm, 2.0 mm to 3.0 mm, 3.0 mm to 4.0 mm, 4.0 mm to 5.0 mm, 5.0 mm to 6.0 mm, 6.0 mm to 7.0 mm, 7.0 mm to 8.0 mm, or 1.0 mm, 1.1 mm, 1.2 mm, 1.3 mm, 1.4 mm, 1.5 mm, 1.6 mm, 1.7 mm, 1.8 mm, 1.9 mm, 2.0 mm, 2.1 mm, 2.2 mm, 2.3 mm, 2.4 mm, 2.5 mm, 2.6 mm, 2.7 mm, 2.8 mm, 2.9 mm, 3.0 mm, 3.1 mm, 3.2 mm, 3.3 mm, 3.4 mm, 3.5 mm, 3.6 mm, 3.7 mm, 3.8 mm, 3.9 mm, 4.0 mm, 4.1 mm, 4.2 mm, 4.3 mm, 4.4 mm, 4.5 mm, 4.6 mm, 4.7 mm, 4.8 mm, 4.9 mm, 5.0 mm, 5.1 mm, 5.2 mm, 5.3 mm, 5.4 mm, 5.5 mm, 5.6 mm, 5.7 mm, 5.8 mm, 5.9 mm, 6.0 mm, 6.1 mm, 6.2 mm, 6.3 mm, 6.4 mm, 6.5 mm, 6.6 mm, 6.7 mm, 6.8 mm, 6.9 mm, 7.0 mm, 7.1 mm, 7.2 mm, 7.3 mm, 7.4 mm, 7.5 mm, 7.6 mm, 7.7 mm, 7.8 mm, 7.9 mm, 8.0 mm, in order to provide the desired area of contact with the heat conduction medium and increase the efficiency of thermal conduction. The distance S1 between each two adjacent partition plates 121A may range from 1.4 mm to 5.0 mm, such as 1.4 mm to 1.5 mm, 1.5 mm to 1.6 mm, 1.6 mm to 1.7 mm, 1.7 mm to 1.8 mm, 1.8 mm to 1.9 mm, 1.9 mm to 2.0 mm, 2.0 mm to 2.1 mm, 2.1 mm to 2.2 mm, 2.2 mm to 2.3 mm, 2.3 mm to 2.4 mm, 2.4 mm to 2.5 mm, 2.5 mm to 2.6 mm, 2.6 mm to 2.7 mm, 2.7 mm to 2.8 mm, 2.8 mm to 2.9 mm, 2.9 mm to 3.0 mm, 3.0 mm to 3.1 mm, 3.1 mm to 3.2 mm, 3.2 mm to 3.3 mm, 3.3 mm to 3.4 mm, 3.4 mm to 3.5 mm, 3.5 mm to 3.6 mm, 3.6 mm to 3.7 mm, 3.7 mm to 3.8 mm, 3.8 mm to 3.9 mm, 3.9 mm to 4.0 mm, 4.0 mm to 4.1 mm, 4.1 mm to 4.2 mm, 4.2 mm to 4.3 mm, 4.3 mm to 4.4 mm, 4.4 mm to 4.5 mm, 4.5 mm to 4.6 mm, 4.6 mm to 4.7 mm, 4.7 mm to 4.8 mm, 4.8 mm to 4.9 mm, 4.9 mm to 5.0 mm, or 1.4 mm, 1.45 mm, 1.5 mm, 1.55 mm, 1.6 mm, 1.65 mm, 1.7 mm, 1.75 mm, 1.8 mm, 1.85 mm, 1.9 mm, 1.95 mm, 2.0 mm, 2.05 mm, 2.1 mm, 2.15 mm, 2.2 mm, 2.25 mm, 2.3 mm, 2.35 mm, 2.4 mm, 2.45 mm, 2.5 mm, 2.55 mm, 2.6 mm, 2.65 mm, 2.7 mm, 2.75 mm, 2.8 mm, 2.85 mm, 2.9 mm, 2.95 mm, 3.0 mm, 3.05 mm, 3.1 mm, 3.15 mm, 3.2 mm, 3.25 mm, 3.3 mm, 3.35 mm, 3.4 mm, 3.45 mm, 3.5 mm, 3.55 mm, 3.6 mm, 3.65 mm, 3.7 mm, 3.75 mm, 3.8 mm, 3.85 mm, 3.9 mm, 3.95 mm, 4.0 mm, 4.05 mm, 4.1 mm, 4.15 mm, 4.2 mm, 4.25 mm, 4.3 mm, 4.35 mm, 4.4 mm, 4.45 mm, 4.5 mm, 4.55 mm, 4.6 mm, 4.65 mm, 4.7 mm, 4.75 mm, 4.8 mm, 4.85 mm, 4.9 mm, 4.95 mm, 5.0 mm, in order to adapt to the distribution of the heat-generating points in the multipoint heat source. The foregoing design of the separated channels 12A in the present invention helps increase the gas-liquid conversion efficiency of the heat conduction medium.

A first confluence channel 122A is provided on one side of the separated channels 12A and is in communication with the first communication opening 13A. A second confluence channel 123A is provided on the opposite side of the separated channels 12A and is in communication with the second communication opening 14A. The confluence channels bring the separated channels 12A into communication with one another. In this embodiment, as shown in FIG. 2, the separated channels 12A are parallel to the first tubes 21A, and in accordance with this structural arrangement, the first confluence channel 122A and the second confluence channel 123A are located on two opposite sides of the multi-channel duct 11A respectively and are parallel to the second tube 22A and the third tube 23A. In an embodiment that is not shown herein, the separated channels 12A are perpendicular to the first tubes 21A instead, and in accordance with this structural arrangement, at least one confluence channel may be provided on at least one of the top and bottom sides of the multi-channel duct 11A to bring the separated channels 12A into communication with one another.

In this embodiment, as shown in FIG. 2, the first connection channel 221A is a connection tube inserted into the first communication opening 13A, and the second connection channel 231A is a connection tube inserted into the second communication opening 14A; thus, the connection channels bring the multi-channel duct 11A, the second tube 22A, and the third tube 23A into communication with one another. In one embodiment, the first tubes 21A, the second tube 22A, the third tube 23A, the first connection channel 221A, and the second connection channel 231A may be made of aluminum, an aluminum alloy, or another similar material; the present invention has no limitation in this regard. In another embodiment, each of the multi-channel duct 11A and the first tubes 21A may be fixed to the periphery of the second tube 22A and the periphery of the third tube 23A on its/their two lateral sides by soldering in order to form an airtight structure; the invention, however, has no limitation on the fixing method.

The first tubes 21A are flat tubes each provided therein with a plurality of capillary tubes 211A. The capillary tubes 211A are formed by dividing walls 212A that are integrally formed with, and inside, the flat tubes. Each dividing wall 212A may have a thickness T2 ranging from 0.2 mm to 0.6 mm, such as 0.2 mm to 0.3 mm, 0.3 mm to 0.4 mm, 0.4 mm to 0.5 mm, 0.5 mm to 0.6 mm, or 0.2 mm, 0.25 mm, 0.3 mm, 0.35 mm, 0.4 mm, 0.45 mm, 0.5 mm, 0.55 mm, or 0.6 mm. Each dividing wall 212A may have a width W2 ranging from 1.0 mm to 4.0 mm, such as 1.0 mm to 2.0 mm, 2.0 mm to 3.0 mm, 3.0 mm to 4.0 mm, or 1.0 mm, 1.1 mm, 1.2 mm, 1.3 mm, 1.4 mm, 1.5 mm, 1.6 mm, 1.7 mm, 1.8 mm, 1.9 mm, 2.0 mm, 2.1 mm, 2.2 mm, 2.3 mm, 2.4 mm, 2.5 mm, 2.6 mm, 2.7 mm, 2.8 mm, 2.9 mm, 3.0 mm, 3.1 mm, 3.2 mm, 3.3 mm, 3.4 mm, 3.5 mm, 3.6 mm, 3.7 mm, 3.8 mm, 3.9 mm, or 4.00 mm. The distance S2 between each two adjacent dividing walls 212A may range from 1.4 mm to 3.0 mm, such as 1.4 mm to 1.5 mm, 1.5 mm to 1.6 mm, 1.6 mm to 1.7 mm, 1.7 mm to 1.8 mm, 1.8 mm to 1.9 mm, 1.9 mm to 2.0 mm, 2.0 mm to 2.1 mm, 2.1 mm to 2.2 mm, 2.2 mm to 2.3 mm, 2.3 mm to 2.4 mm, 2.4 mm to 2.5 mm, 2.5 mm to 2.6 mm, 2.6 mm to 2.7 mm, 2.7 mm to 2.8 mm, 2.8 mm to 2.9 mm, 2.9 mm to 3.0 mm, or 1.4 mm, 1.45 mm, 1.5 mm, 1.55 mm, 1.6 mm, 1.65 mm, 1.7 mm, 1.75 mm, 1.8 mm, 1.85 mm, 1.9 mm, 1.95 mm, 2.0 mm, 2.05 mm, 2.1 mm, 2.15 mm, 2.2 mm, 2.25 mm, 2.3 mm, 2.35 mm, 2.4 mm, 2.45 mm, 2.5 mm, 2.55 mm, 2.6 mm, 2.65 mm, 2.7 mm, 2.75 mm, 2.8 mm, 2.85 mm, 2.9 mm, 2.95 mm, or 3.0 mm. The foregoing design of the flat tubes in the present invention helps not only enhance the structural strength of the flat tubes, thereby solving the problem that the lengthwise central portions of the flat tubes may otherwise have insufficient pressure tolerance and reducing the chance of tube bursting, but also increase the gas-liquid conversion efficiency of the heat conduction medium so as to provide more efficient heat dissipation. In terms of application, placing each flat tube in a horizontal position allows the gaseous-state heat conduction medium to diffuse to the upper halves of the flat tubes and the liquid-state heat conduction medium to be formed in the lower halves of the flat tubes and flow out of the flat tubes naturally through a capillary action in the flat tubes. In one embodiment, the flat tubes may be aluminum extruded tubes so that heat can be carried away rapidly through the increased contact area provided by the capillary tubes 211A. As the aluminum extrusion design allows the heat exchange area to be significantly enlarged, the uniformity of heat distribution as well as the amount of the heat carried away can be effectively increased, making it possible to dissipate heat rapidly. The invention has no limitation on the number of the first tubes 21A (flat tubes), provided that the number is properly designed according to the overfill amount of the heat conduction medium; the total capacity of the multi-channel duct 11A, the second tube 22A, and the third tube 23; and the target heat exchange efficiency.

A heat dissipation fin (not shown) is provided between each two adjacent first tubes 21A (flat tubes) to increase heat exchange efficiency. In one embodiment, the heat dissipation fins may be, for example, plates in a wound configuration, series-connected plates, soldered plates, rolled plates, or plates that are fastened together; the present invention has no limitation in this regard. In another embodiment, the heat dissipation fins may be made of aluminum, an aluminum alloy, or another similar material; the invention has no limitation in this regard, either.

The following paragraphs describe an application of the heat dissipation device 100 for a multipoint heat source according to the first embodiment of the present invention.

Figure 4:
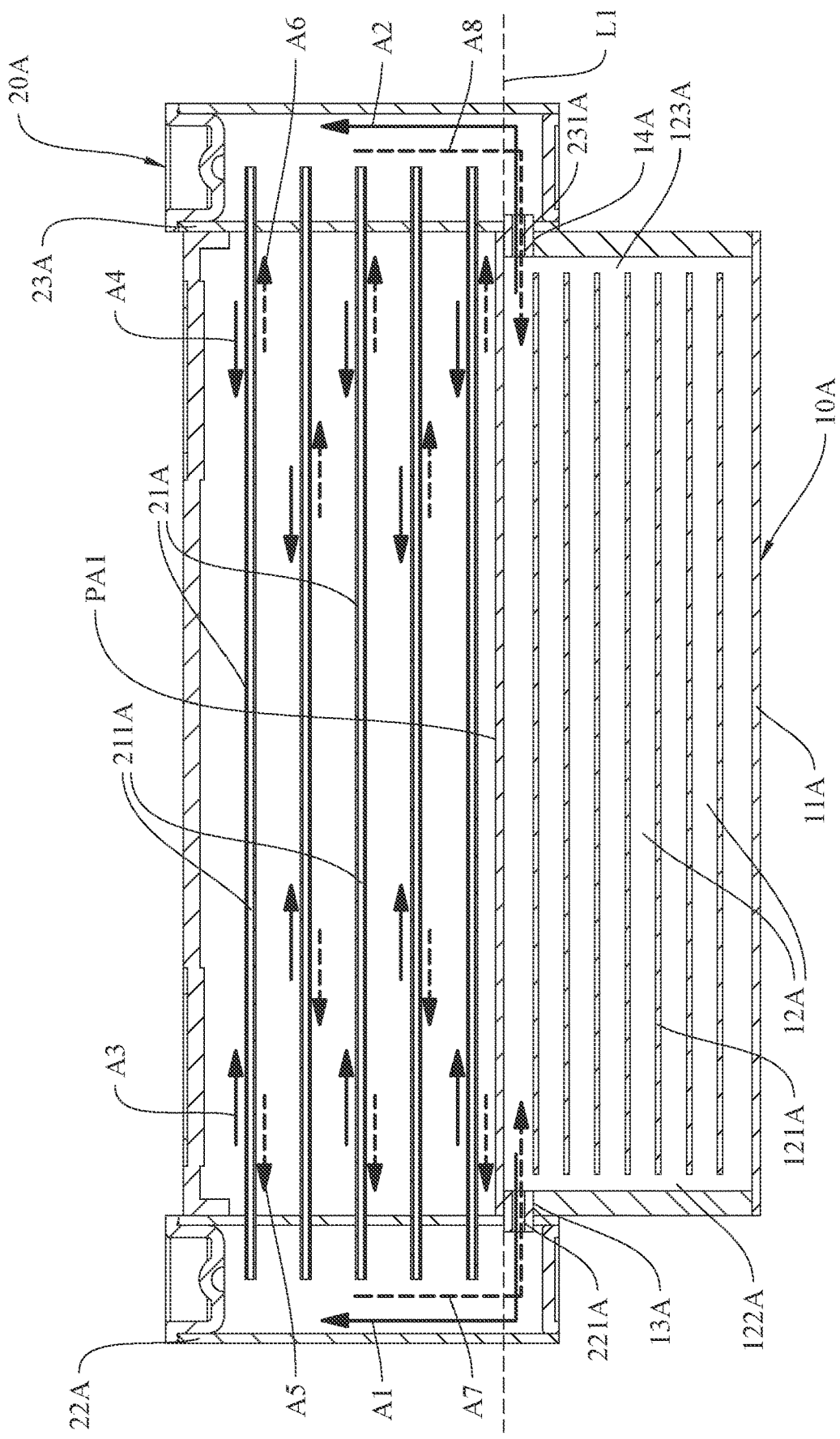
FIG. 4 shows a state of use of the heat dissipation device for a multipoint heat source according to the first embodiment of the invention.

Please refer to FIG. 4 for a state of use of the heat dissipation device 100 for a multipoint heat source.

In this application, the second tube 22A and the third tube 23A on two opposite lateral sides of the heat dissipation device 100 for a multipoint heat source are disposed at the same height, and the multi-channel duct 11A is disposed below the second tube 22A and the third tube 23A. The multi-channel duct 11A is filled with a liquid-state heat conduction medium in an overfilling manner (e.g., to the maximum line L1).

The wide side PA2 of the multi-channel duct 11A may be in direct or indirect contact with the multipoint heat source 30 (see FIG. 1) in order for the heat of the heat source to diffuse into, and thereby increase the temperature inside, the multi-channel duct 11A. The liquid-state heat conduction medium absorbs the heat and is thus converted into the gaseous state. The gaseous-state heat conduction medium rises from each separated channel 12A into the second tube 22A and the third tube 23A (as indicated by the arrows A1 and A2). Moreover, the gaseous-state heat conduction medium at the back end generates a forward propelling force that produces a siphon effect and thereby urges the gaseous-state heat conduction medium to diffuse into each first tube 21A (flat tube) (as indicated by the arrows A3 and A4). The gaseous-state heat conduction medium exchanges heat with the capillary tubes 211A of the first tubes 21A (and the heat dissipation fins) and is then gradually condensed into a liquid-state heat conduction medium. The liquid-state heat conduction medium flows toward the two lateral sides of each first tube 21A through a capillary action and returns to the second tube 22A and the third tube 23A under the force of gravity (as indicated by the arrows A5 and A6). Lastly, the liquid-state heat conduction medium flows back into the multi-channel duct 11A due to the aforesaid siphon effect (as indicated by the arrows A7 and A8) and is therefore allowed to absorb heat (i.e., be heated) again and be converted into the gaseous state once more. The heat conduction medium is thus circulated through the evaporator unit 10A and the condenser unit 20A while alternating between a liquid phase and a gaseous phase.

Figure 5:
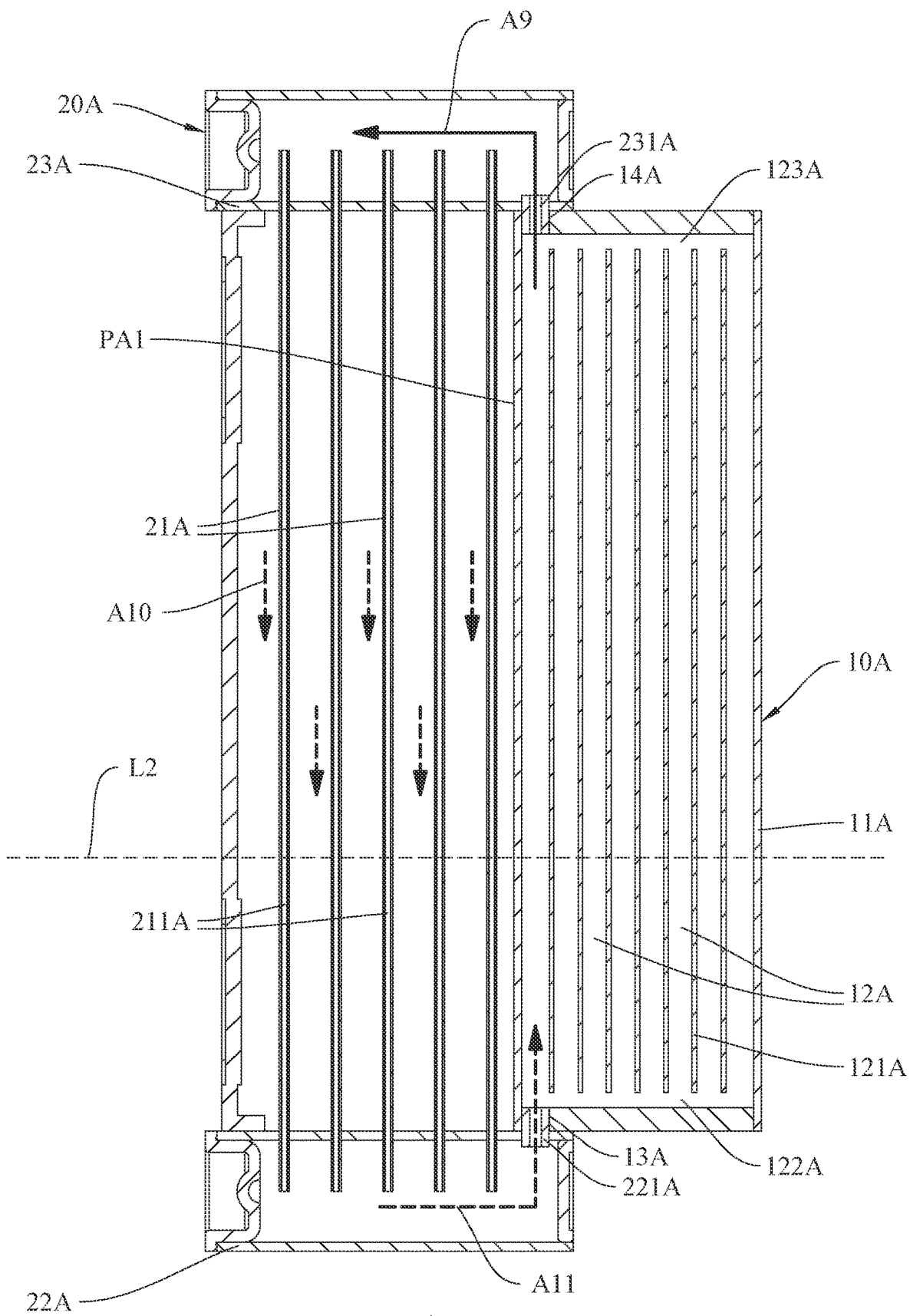
FIG. 5 shows another state of use of the heat dissipation device for a multipoint heat source according to the first embodiment of the invention.

The following paragraphs describe another application of the heat dissipation device 100 for a multipoint heat source according to the first embodiment of the present invention. Please refer to FIG. 5 for another state of use of the heat dissipation device 100 for a multipoint heat source.

In this application, the third tube 23A of the heat dissipation device 100 for a multipoint heat source is disposed right above the second tube 22A, and the second tube 22A is filled with a liquid-state heat conduction medium in an overfilling manner such that the bottom side of the multi-channel duct 11A and the bottom sides of the first tubes 21A are also filled with the liquid-state heat conduction medium (e.g., to the maximum line L2).

The wide side PA2 of the multi-channel duct 11A may be in direct or indirect contact with the multipoint heat source 30 (see FIG. 1) in order for the heat of the heat source to diffuse into, and thereby increase the temperature inside, the multi-channel duct 11A. The liquid-state heat conduction medium absorbs the heat and is thus converted into the gaseous state. The gaseous-state heat conduction medium rises from each separated channel 12A into the third tube 23A (as indicated by the arrow A9). Moreover, the gaseous-state heat conduction medium at the back end generates a forward propelling force that produces a siphon effect and thereby urges the gaseous-state heat conduction medium to diffuse into the first tubes 21A (flat tubes). The gaseous-state heat conduction medium exchanges heat with the capillary tubes 211A of the first tubes 21A (and the heat dissipation fins) and is then gradually condensed into a liquid-state heat conduction medium. The liquid-state heat conduction medium flows into the second tube 22A through a capillary action and under the force of gravity (as indicated by the arrow A10). Lastly, the liquid-state heat conduction medium returns into the multi-channel duct 11A due to the aforesaid siphon effect (as indicated by the arrow A11) and is therefore allowed to absorb heat (i.e., be heated) again and be converted into the gaseous state once more. The heat conduction medium is thus circulated through the evaporator unit 10A and the condenser unit 20A while alternating between a liquid phase and a gaseous phase.

Figure 6:
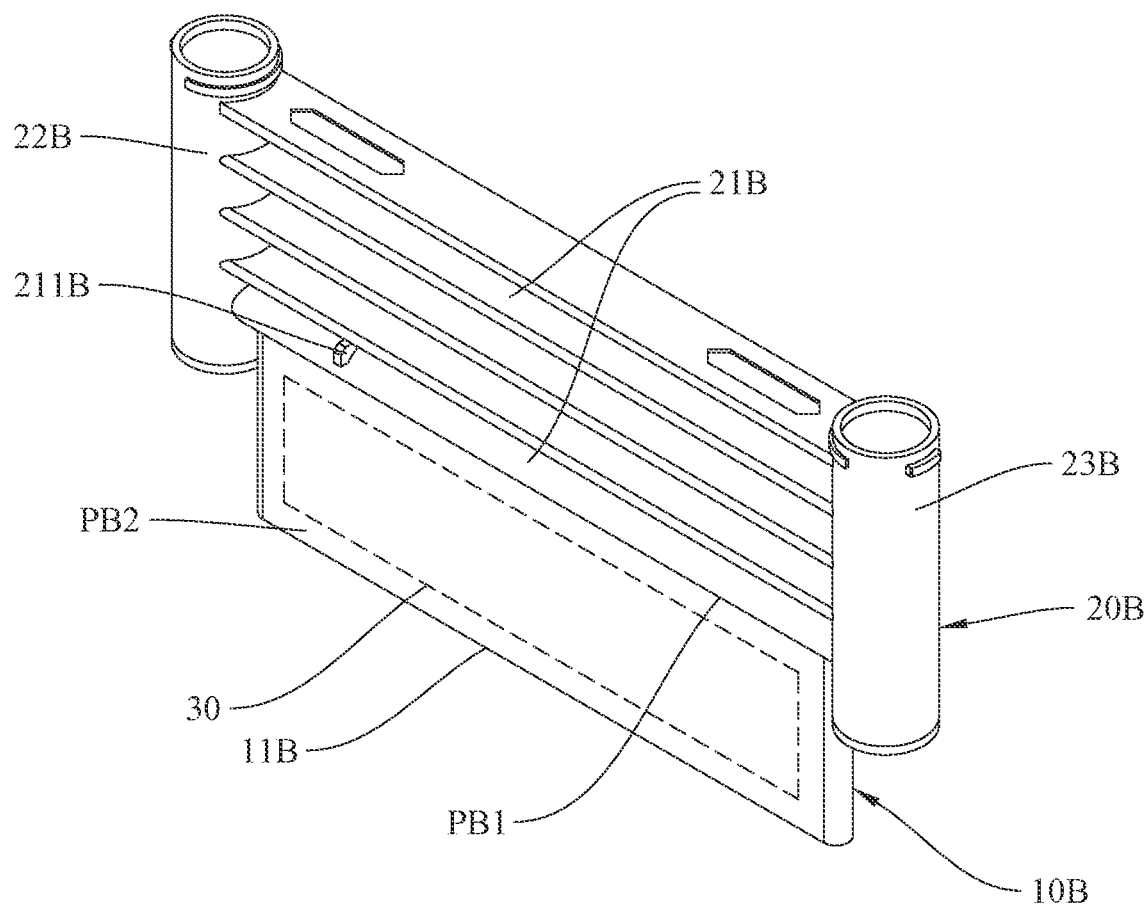
FIG. 6 is a perspective view of the heat dissipation device for a multipoint heat source according to the second embodiment of the invention.
Figure 7:
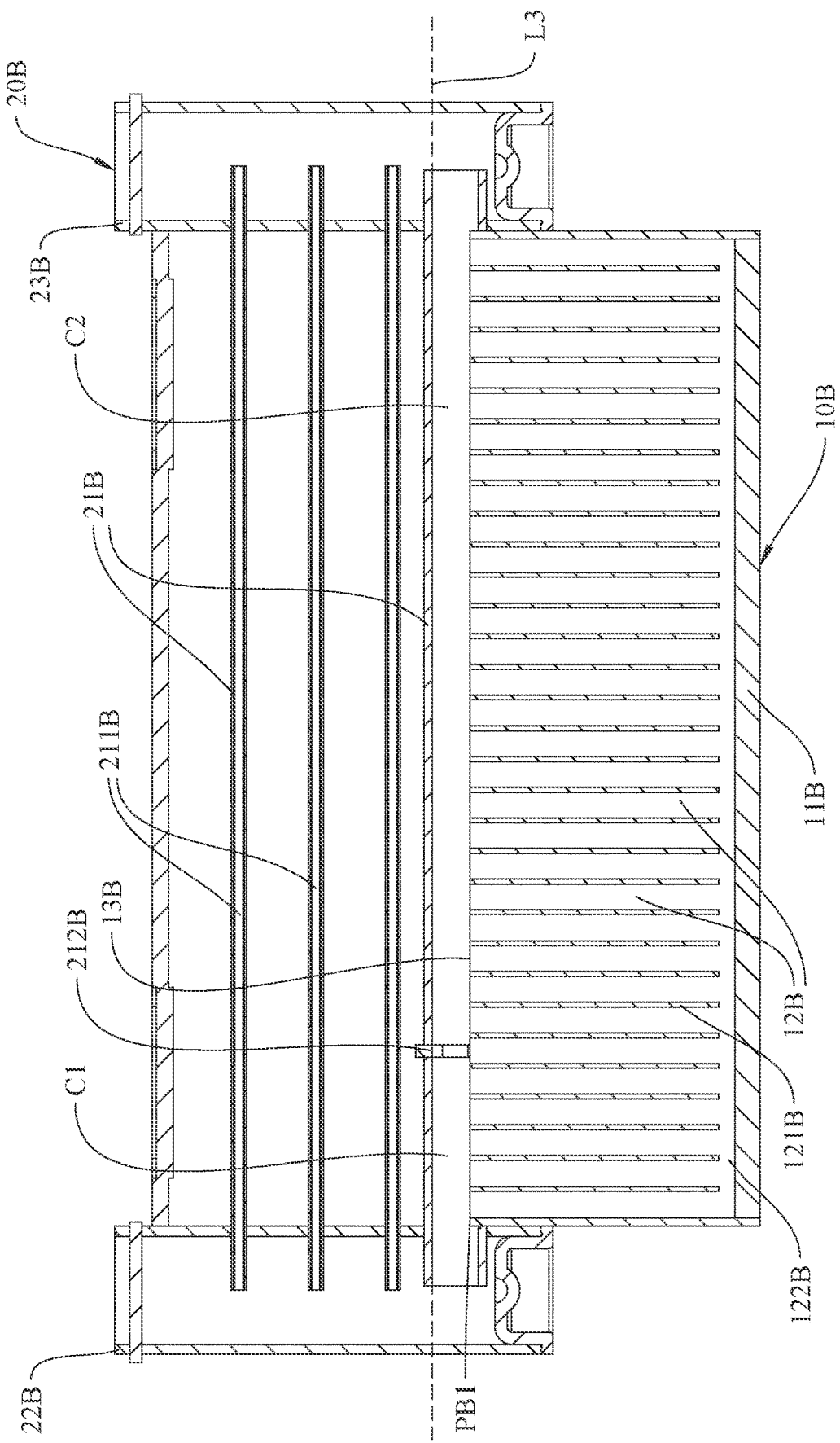
FIG. 7 is a sectional view of the heat dissipation device for a multipoint heat source according to the second embodiment of the invention.

Another embodiment of the present invention is described below with reference to FIG. 6 and FIG. 7, which are respectively a perspective view and a sectional view of the heat dissipation device for a multipoint heat source according to the second embodiment of the invention. As shown in FIG. 6 and FIG. 7, the second embodiment is different from the first embodiment in the way the evaporator unit and the condenser unit are connected. The same structures in the two embodiments will not be described repeatedly, nor will the foregoing applications, which apply to the second embodiment as well.

According to the second embodiment, the heat dissipation device 200 for a multipoint heat source includes an evaporator unit 10B and a condenser unit 20B. The evaporator unit 10B includes a multi-channel duct 11B, a plurality of separated channels 12B provided in the multi-channel duct 11B, and a communication opening 13B that is in communication with the separated channels 12B and is provided at a narrow side PB1 of the multi-channel duct 11B. The condenser unit 20B includes a plurality of first tubes 21B that are arranged in a parallel manner in a first direction, a second tube 22B provided at a first end of the first tubes 21B, and a third tube 23B provided at a second end of the first tubes 21B. The communication opening 13B at the narrow side PB1 of the multi-channel duct 11B is inserted perpendicularly into the bottom side of the bottommost first tube 21B such that the separated channels 12B are in communication with the bottommost first tube 21B. A wide side PB2 of the multi-channel duct 11B is attached to the multipoint heat source 30 in order for a heat conduction medium to be circulated through the evaporator unit 10B and the condenser unit 20B while alternating between a liquid phase and a gaseous phase.

There is only one multi-channel duct 11B. The manufacturing process, material, and structure of the multi-channel duct 11B (including the partition plates 121B formed in the multi-channel duct 11B to define the separated channels 12B) are the same as those of the multi-channel duct 11A in the previous embodiment and therefore will not be described repeatedly. A confluence channel 122B is provided on the side of the separated channels 12B that faces directly away from the communication opening 13B, and the confluence channel 122B is parallel to the communication opening 13B. The confluence channel 122B brings the separated channels 12B into communication with one another. In this embodiment, as shown in FIG. 7, the separated channels 12B are perpendicular to the first tubes 21B, and in accordance with this structural arrangement, the confluence channel 122B is located on the bottom side of the multi-channel duct 11B. In an embodiment that is not shown herein, the separated channels 12B are parallel to the first tubes 21B instead, and in accordance with this structural arrangement, the confluence channel may be located on at least one side of the multi-channel duct 11B and be parallel to the second tube 22B and the third tube 23B in order to bring the separated channels 12B into communication with one another.

The bottommost first tube 21B is a circular tube, and a dividing plate 212B is provided in the bottommost first tube 21B (circular tube). The dividing plate 212B divides the interior of the bottommost first tube 21B into a first chamber C1 that is in communication with the second tube 22B and a second chamber C2 that is in communication with the third tube 23B, wherein the first chamber C1 has a smaller space than the second chamber C2. In one embodiment, the dividing plate 212B has a through hole that brings the first chamber C1 and the second chamber C2 into communication with each other. In another embodiment, the bottommost first tube 21B forms a single chamber therein (not shown). In yet another embodiment, the dividing plate 212B may be made of aluminum, an aluminum alloy, or another similar material; the present invention has no limitation in this regard. In still another embodiment, the dividing plate 212B may be fixed in the hole of the bottommost first tube 21B by soldering in order to divide the interior of the tube into two chambers, or the dividing plate 212B may be fixed between two circular tubes by soldering in order to form the bottommost first tube 21B and define the two chambers therein. The present invention has no limitation on how or where the dividing plate 212B is fixed.

The first tubes 21B arranged above the circular tube (the bottommost first tube 21B) are flat tubes, and each flat tube is provided therein with a plurality of capillary tubes 211B. The manufacturing process, material, and structure of the flat tubes (including the dividing walls provided in each flat tube to form the capillary tubes 211B) are the same as those of the flat tubes (the first tubes 21A) in the previous embodiment and therefore will not be described repeatedly. A heat dissipation fin (not shown) is provided between each two adjacent first tubes 21B arranged above the bottommost first tube 21B. The manufacturing process, material, and structure of the heat dissipation fins are the same as those of the heat dissipation fins in the previous embodiment and therefore will not be described repeatedly.

In applications where the second tube 22B and the third tube 23B of the heat dissipation device 200 for a multipoint heat source are disposed at the same height, and where the multi-channel duct 11B is disposed below the tubes, the multi-channel duct 11B is filled with a liquid-state heat conduction medium in an overfilling manner (e.g., to the maximum line L3). In applications where the third tube 23B of the heat dissipation device 200 for a multipoint heat source is disposed above the second tube 22B, the second tube 22B is filled with a liquid-state heat conduction medium in an overfilling manner such that the bottom side of the multi-channel duct 11B and the bottom sides of the first tubes 21B are also filled with the liquid-state heat conduction medium (not shown).

Figure 8:
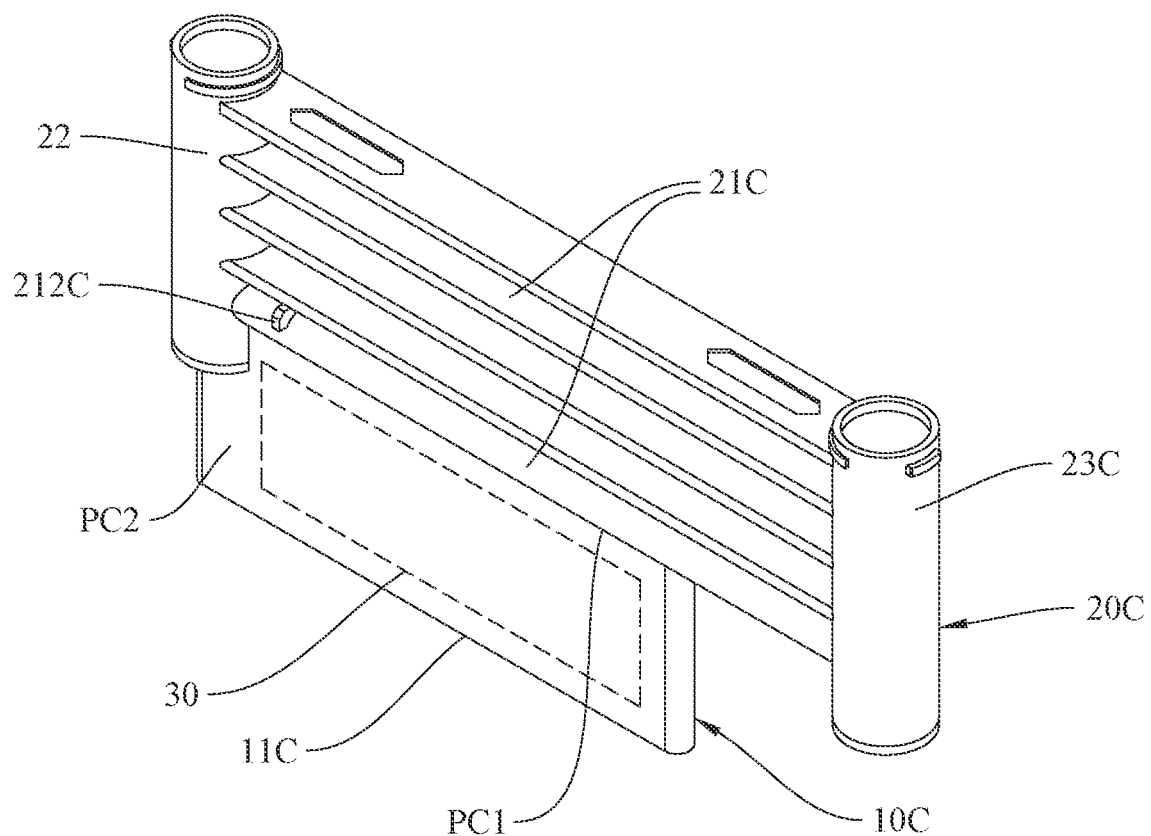
FIG. 8 is a perspective view of the heat dissipation device for a multipoint heat source according to the third embodiment of the invention.
Figure 9:
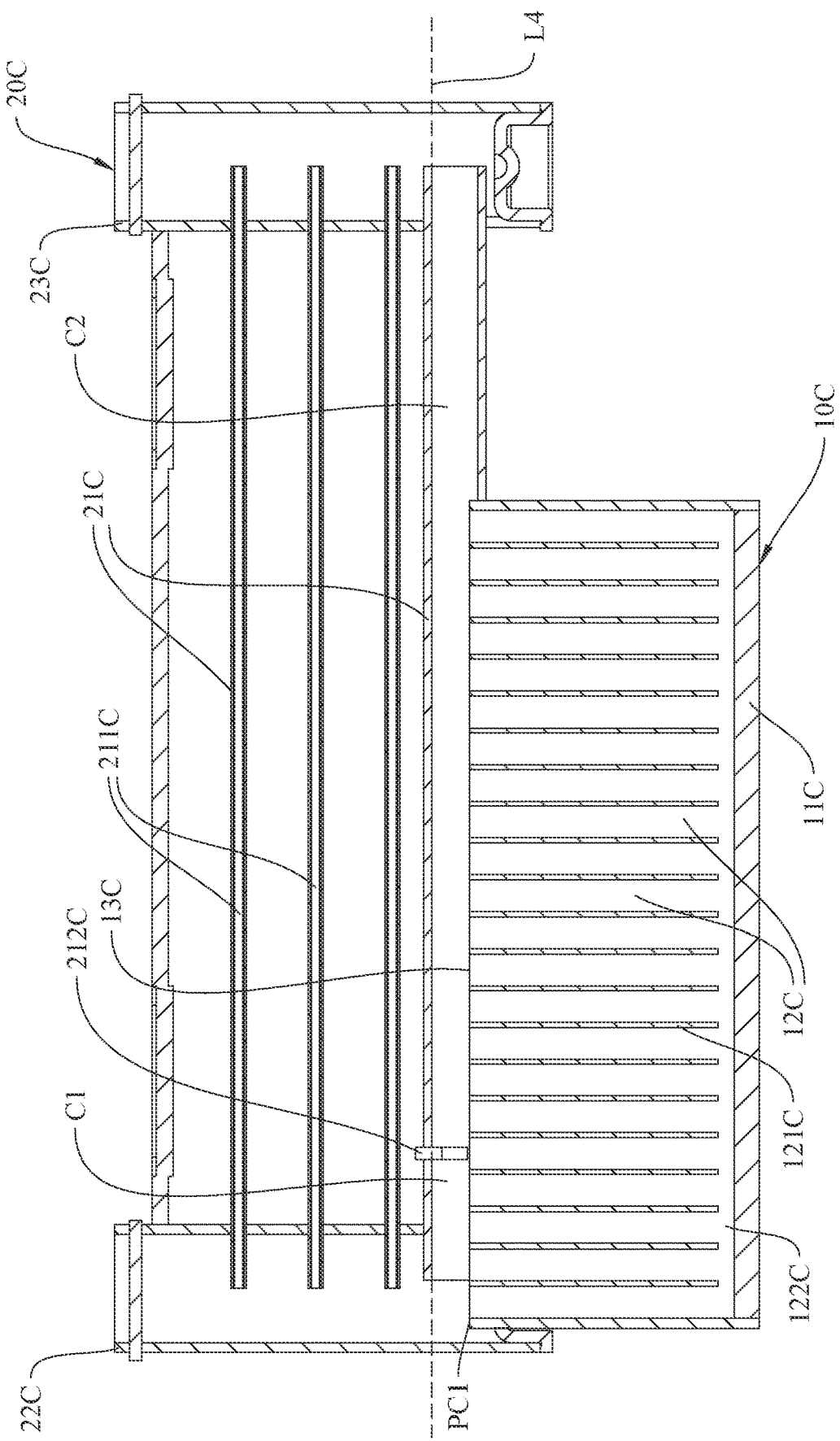
FIG. 9 is a sectional view of the heat dissipation device for a multipoint heat source according to the third embodiment of the invention.

Yet another embodiment of the present invention is described below with reference to FIG. 8 and FIG. 9, which are respectively a perspective view and a sectional view of the heat dissipation device for a multipoint heat source according to the third embodiment of the invention. As shown in FIG. 8 and FIG. 9, the third embodiment is different from the second embodiment in the way the evaporator unit and the condenser unit are connected. The same structures in the two embodiments will not be described repeatedly, nor will the foregoing applications, which apply to the third embodiment as well.

According to the third embodiment, the heat dissipation device 300 for a multipoint heat source includes an evaporator unit 10C and a condenser unit 20C. The evaporator unit 10C includes a multi-channel duct 11C, a plurality of separated channels 12C provided in the multi-channel duct 11C, and a communication opening 13C that is in communication with the separated channels 12C and is provided at a narrow side PC1 of the multi-channel duct 11C. The condenser unit 20C includes a plurality of first tubes 21C that are arranged in a parallel manner in a first direction, a second tube 22C provided at a first end of the first tubes 21C, and a third tube 23C provided at a second end of the first tubes 21C. The communication opening 13C at the narrow side PC1 of the multi-channel duct 11C is inserted perpendicularly into the bottommost first tube 21C and extends into the bottom side of the second tube 22C and/or the bottom side of the third tube 23C such that the separated channels 12C are in communication with the bottommost first tube 21C and the second tube 22C and/or the bottom side of the third tube 23C. A wide side PC2 of the multi-channel duct 11C is attached to the multipoint heat source 30 in order for a heat conduction medium to be circulated through the evaporator unit 10C and the condenser unit 20C while alternating between a liquid phase and a gaseous phase.

In this embodiment, the communication opening 13C at the narrow side PC1 of the multi-channel duct 11C is inserted perpendicularly into the bottommost first tube 21C and extends into the bottom side of the second tube 22C such that the separated channels 12C are in communication with the bottommost first tube 21C and the second tube 22C. In an embodiment that is not shown herein, the communication opening 13C at the narrow side PC1 of the multi-channel duct 11C is inserted perpendicularly into the bottommost first tube 21C and extends into both the bottom side of the second tube 22C and the bottom side of the third tube 23C such that the separated channels 12C are in communication with the bottommost first tube 21C, the second tube 22C, and the third tube 23C. In another embodiment that is not shown herein, the communication opening 13C at the narrow side PC1 of the multi-channel duct 11C is inserted perpendicularly into the bottommost first tube 21C and extends into the bottom side of the third tube 23C such that the separated channels 12C are in communication with the bottommost first tube 21C and the third tube 23C.

There is only one multi-channel duct 11C. The manufacturing process, material, and structure of the multi-channel duct 11C (including the partition plates 121C formed in the multi-channel duct 11C to define the separated channels 12C) are the same as those of the multi-channel ducts 11A and 11B in the previous embodiments and therefore will not be described repeatedly. A confluence channel 122C is provided on the side of the separated channels 12C that faces directly away from the communication opening 13C, and the confluence channel 122C is parallel to the communication opening 13C. The confluence channel 122C brings the separated channels 12C into communication with one another. In this embodiment, as shown in FIG. 9, the separated channels 12C are perpendicular to the first tubes 21C, and in accordance with this structural arrangement, the confluence channel 122C is located on the bottom side of the multi-channel duct 11C. In an embodiment that is not shown herein, the separated channels 12C are parallel to the first tubes 21C instead, and in accordance with this structural arrangement, the confluence channel may be located on at least one side of the multi-channel duct 11C and be parallel to the second tube 22C and the third tube 23C in order to bring the separated channels 12C into communication with one another.

The bottommost first tube 21C is a circular tube, and a dividing plate 212C is provided in the bottommost first tube 21C (circular tube) to divide the interior of the bottommost first tube 21C into two chambers. The manufacturing process, material, and structure of the dividing plate 212C are the same as those of the dividing plate 212B in the previous embodiment and therefore will not be described repeatedly.

The first tubes 21C arranged above the circular tube (the bottommost first tube 21C) are flat tubes, and each flat tube is provided therein with a plurality of capillary tubes 211C. The manufacturing process, material, and structure of the flat tubes (including the dividing walls provided in each flat tube to form the capillary tubes 211C) are the same as those of the flat tubes (the first tubes 21A and 21B) in the previous embodiments and therefore will not be described repeatedly. A heat dissipation fin (not shown) is provided between each two adjacent first tubes 21C arranged above the bottommost first tube 21C. The manufacturing process, material, and structure of the heat dissipation fins are the same as those of the heat dissipation fins in the previous embodiments and therefore will not be described repeatedly. Applications of the heat dissipation device 300 for a multipoint heat source (including applications involving a change in the relative arrangement of the tubes and the multi-channel duct) and the reference levels of the liquid-state heat conduction medium added are the same as those of the heat dissipation device 200 for a multipoint heat source and therefore will not be described repeatedly.

In summary, the evaporator unit in the present invention includes a multi-channel duct. At least one narrow side of the multi-channel duct has a communication opening in communication with the bottom side of at least one tube of the condenser unit, and a wide side of the multi-channel duct is attached to a multipoint heat source in order to absorb heat from the heat source. A heat conduction medium, therefore, can be circulated through the evaporator unit and the condenser unit while alternating between a liquid phase and a gaseous phase to dissipate heat.

While a detailed description of the present invention has been given above, it should be understood that the foregoing embodiments are only some preferred ones of the invention and are not intended to be restrictive of the scope of the invention. Any equivalent change or modification that is based on the appended claims shall fall within the scope of the invention.

What is claimed is:

1. A heat dissipation device for a multipoint heat source, comprising:
   an evaporator unit comprising a multi-channel duct, a plurality of separated channels provided in the multi-channel duct, a first communication opening, and a second communication opening, wherein the communication openings are provided at two lateral narrow sides of the multi-channel duct respectively; and
   a condenser unit comprising a plurality of first tubes arranged in a parallel manner in a first direction, a second tube provided at a first end of the first tubes, and a third tube provided at a second end of the first tubes, wherein the second tube has a bottom side provided with a first connection channel in communication with the first communication opening, and the third tube has a bottom side provided with a second connection channel in communication with the second communication opening;
   wherein the narrow sides of the multi-channel duct face the first tubes and are parallel or generally parallel to the first tubes, and the multi-channel duct has a wide side attached to the multipoint heat source in order for a heat conduction medium to be circulated through the evaporator unit and the condenser unit while alternating between a liquid phase and a gaseous phase;
   wherein a first confluence channel is provided on one side of the separated channels and is in communication with the first communication opening, and a second confluence channel is provided on an opposite side of the separated channels and is in communication with the second communication opening.

2. The heat dissipation device for a multipoint heat source as claimed in claim 1, wherein the separated channels are perpendicular to the first tubes.

3. The heat dissipation device for a multipoint heat source as claimed in claim 1, wherein the separated channels are parallel to the first tubes.

4. The heat dissipation device for a multipoint heat source as claimed in claim 1, wherein the first tubes are flat tubes, and each said flat tube is provided therein with a plurality of capillary tubes.

5. The heat dissipation device for a multipoint heat source as claimed in claim 1, wherein a heat dissipation fin is provided between each two adjacent ones of the first tubes.

6. A heat dissipation device for a multipoint heat source, comprising:
   an evaporator unit comprising a multi-channel duct, a plurality of separated channels provided in the multi-channel duct, and a communication opening in communication with the separated channels and provided at a narrow side of the multi-channel duct; and
   a condenser unit comprising a plurality of first tubes arranged in a parallel manner in a first direction, a second tube provided at a first end of the first tubes, and a third tube provided at a second end of the first tubes;
   wherein the communication opening at the narrow side of the multi-channel duct is inserted perpendicularly into a bottom side of a bottommost said first tube such that the separated channels are in communication with the bottommost first tube, and the multi-channel duct has a wide side attached to the multipoint heat source in order for a heat conduction medium to be circulated through the evaporator unit and the condenser unit while alternating between a liquid phase and a gaseous phase;
   wherein the bottommost first tube is provided therein with a dividing plate, the dividing plate divides an interior of the bottommost first tube into a first chamber in communication with the second tube and a second chamber in communication with the third tube, the second chamber has a smaller space than the first chamber, and the dividing plate has a through hole bringing the first chamber and the second chamber into communication with each other.

7. A heat dissipation device for a multipoint heat source, comprising:
   an evaporator unit comprising a multi-channel duct, a plurality of separated channels provided in the multi-channel duct, and a communication opening in communication with the separated channels and provided at a narrow side of the multi-channel duct; and
   a condenser unit comprising a plurality of first tubes arranged in a parallel manner in a first direction, a second tube provided at a first end of the first tubes, and a third tube provided at a second end of the first tubes;
   wherein the communication opening at the narrow side of the multi-channel duct is inserted perpendicularly into a bottommost said first tube and extends into at least one of the second tube and the third tube such that the separated channels are in communication with the bottommost first tube and the at least one of the second tube and the third tube, and the multi-channel duct has a wide side attached to the multipoint heat source in order for a heat conduction medium to be circulated through the evaporator unit and the condenser unit while alternating between a liquid phase and a gaseous phase;

wherein the bottommost first tube is provided therein with a dividing plate, the dividing plate divides an interior of the bottommost first tube into a first chamber in communication with the second tube and a second chamber in communication with the third tube, the second chamber has a smaller space than the first chamber, and the dividing plate has a through hole bringing the first chamber and the second chamber into communication with each other.

8. The heat dissipation device for a multipoint heat source as claimed in claim 6, wherein a confluence channel parallel to the communication opening is provided on a side of the separated channels that faces directly away from the communication opening.

9. The heat dissipation device for a multipoint heat source as claimed in claim 7, wherein a confluence channel parallel to the communication opening is provided on a side of the separated channels that faces directly away from the communication opening.

10. The heat dissipation device for a multipoint heat source as claimed in claim 6, wherein the separated channels are perpendicular to the first tubes.

11. The heat dissipation device for a multipoint heat source as claimed in claim 7, wherein the separated channels are perpendicular to the first tubes.

12. The heat dissipation device for a multipoint heat source as claimed in claim 6, wherein the separated channels are parallel to the first tubes.

13. The heat dissipation device for a multipoint heat source as claimed in claim 7, wherein the separated channels are parallel to the first tubes.

14. The heat dissipation device for a multipoint heat source as claimed in claim 6, wherein the bottommost first tube is a circular tube, the first tubes arranged above the circular tube are flat tubes, and each said flat tube is provided therein with a plurality of capillary tubes.

15. The heat dissipation device for a multipoint heat source as claimed in claim 7, wherein the bottommost first tube is a circular tube, the first tubes arranged above the circular tube are flat tubes, and each said flat tube is provided therein with a plurality of capillary tubes.

16. The heat dissipation device for a multipoint heat source as claimed in claim 6, wherein a heat dissipation fin is provided between each two adjacent ones of the first tubes arranged above the bottommost first tube.

17. The heat dissipation device for a multipoint heat source as claimed in claim 7, wherein a heat dissipation fin is provided between each two adjacent ones of the first tubes arranged above the bottommost first tube.

\* \* \* \* \*